(12) United States Patent
Matsumoto

(10) Patent No.: US 11,139,146 B2
(45) Date of Patent: Oct. 5, 2021

(54) SET OF APERTURE SUBSTRATES FOR MULTIPLE BEAMS AND MULTI CHARGED PARTICLE BEAM APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/799,982

(22) Filed: Feb. 25, 2020

(65) Prior Publication Data

US 2020/0273668 A1    Aug. 27, 2020

(30) Foreign Application Priority Data

Feb. 27, 2019 (JP) .............................. JP2019-034558

(51) Int. Cl.
*H01J 37/31* (2006.01)
*H01J 37/04* (2006.01)
*H01J 37/317* (2006.01)

(52) U.S. Cl.
CPC ........ *H01J 37/3177* (2013.01); *H01J 37/045* (2013.01); *H01J 2237/0437* (2013.01); *H01J 2237/1501* (2013.01)

(58) Field of Classification Search
CPC .................. H01J 37/3177; H01J 37/045; H01J 2237/0437; H01J 2237/1501
USPC ....... 250/396 R, 397, 396 ML, 492.1, 492.2, 250/492.21, 492.22, 492.23, 492.3
See application file for complete search history.

(56) References Cited

U.S. PATENT DOCUMENTS

| 6,465,796 | B1 | 10/2002 | Haraguchi et al. | |
| 8,431,912 | B2 | 4/2013 | Looije | |
| 8,546,767 | B2 * | 10/2013 | Platzgummer | .......... H01J 37/28 250/396 R |

(Continued)

FOREIGN PATENT DOCUMENTS

| GB | 2 349 737 B | 6/2001 |
| JP | 2000-30647 A | 1/2000 |

(Continued)

OTHER PUBLICATIONS

Combined Taiwanese Office Action and Search Report dated Aug. 31, 2020 in corresponding Taiwanese Patent Application No. 109103646 (with English Translation), 8 pages.

*Primary Examiner* — Nicole M Ippolito
(74) *Attorney, Agent, or Firm* — Oblon, McClelland, Maier & Neustadt, L.L.P.

(57) ABSTRACT

A set of aperture substrates for multiple beams includes a first shaping aperture array substrate including a plurality of first openings, the first shaping aperture array substrate being irradiated with a charged particle beam in a region in which the first openings are formed whereby first multiple beams are formed with a part of the charged particle beams having passed respectively through the first openings, and a second shaping aperture array substrate including a plurality of second openings through which corresponding first multiple beam passes respectively whereby second multiple beams are formed. Each of the second multiple beams is shaped by a pair of opposite sides of the first opening and a pair of opposite sides of the second opening.

11 Claims, 7 Drawing Sheets

(56) References Cited

U.S. PATENT DOCUMENTS

| | | | |
|---|---|---|---|
| 2008/0217554 A1* | 9/2008 | Abe | B82Y 10/00 250/398 |
| 2010/0117001 A1 | 5/2010 | Looije | |
| 2012/0115306 A1* | 5/2012 | Yamazaki | B82Y 10/00 438/460 |
| 2017/0309440 A1* | 10/2017 | Nishimura | H01J 37/1472 |

FOREIGN PATENT DOCUMENTS

| | | |
|---|---|---|
| JP | 2001-15428 A | 1/2001 |
| JP | 2003-332204 A | 11/2003 |
| JP | 2018-98242 A | 6/2018 |
| TW | 201022856 A1 | 6/2010 |

* cited by examiner

SET OF APERTURE SUBSTRATES FOR MULTIPLE BEAMS AND MULTI CHARGED PARTICLE BEAM APPARATUS

CROSS REFERENCE TO RELATED APPLICATION

This application is based upon and claims benefit of priority from the Japanese Patent Application No. 2019-034558, filed on Feb. 27, 2019, the entire contents of which are incorporated herein by reference.

FIELD

The present invention relates to a set of aperture substrates for multiple beams and a multi charged particle beam apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

A writing apparatus using multiple beams can greatly improve a throughput in comparison with a writing apparatus using a single electron beam because the apparatus using multiple beams can apply many beams at once. In a multi-beam writing apparatus using a blanking aperture array, which is one type of multi-beam writing apparatus, multiple beams (plurality of electron beams) are formed, for example, by causing an electron beam emitted from one electron gun to pass through a shaping aperture array having a plurality of openings. The multiple beams pass respectively through corresponding blankers in the blanking aperture array. The blanking aperture array includes pairs of electrodes for deflecting the beams individually, and an opening for passage of the beam is formed between each pair of electrodes. Blanking deflection of the electron beam passing through the blanker is performed by fixedly holding one of the pair of electrodes (constituting the blanker) at a ground potential and by switching the other electrode between the ground potential and a different potential. The electron beam having been deflected by the blanker is blocked while the electron beam having been not deflected is applied onto a sample.

In the multi-beam writing apparatus, a writing time can be shortened by increasing a current amount. However, if the current amount is increased excessively, a problem arises in that a beam path is changed with the Coulomb effect and writing accuracy degrades. It is therefore desirable that whether to perform the writing at a high speed with a large current or at high accuracy with a small current is switched depending on the grade of a product. From that point of view, a method of switching the current amount by adjusting the size of each of the multiple beams is proposed.

For example, U.S. Pat. No. 8,546,767 discloses a writing apparatus including a first aperture substrate that forms multiple beams, and a second aperture substrate in which a first opening array and a second opening array are arranged in an offset relation. Each opening of the first opening array has a larger size than that of the second opening array. A beam size can be changed by adjusting relative positions of the first aperture substrate and the second aperture substrate, and by switching whether the multiple beams pass through the first opening array or the second opening array.

According to the above-described method, however, the number of beam sizes is limited by types of the opening arrays formed in the second aperture substrate. For example, when two types of opening arrays, i.e., the first opening array and the second opening array, are formed in the second aperture substrate, only two beam sizes can be formed.

DETAILED DESCRIPTION

In one embodiment, a set of aperture substrates for multiple beams includes a first shaping aperture array substrate including a plurality of first openings, the first shaping aperture array substrate being irradiated with a charged particle beam in a region in which the first openings are formed whereby first multiple beams are formed with a part of the charged particle beams having passed respectively through the first openings, and a second shaping aperture array substrate including a plurality of second openings through which corresponding first multiple beam passes respectively whereby second multiple beams are formed. Each of the second multiple beams is shaped by a pair of opposite sides of the first opening and a pair of opposite sides of the second opening.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
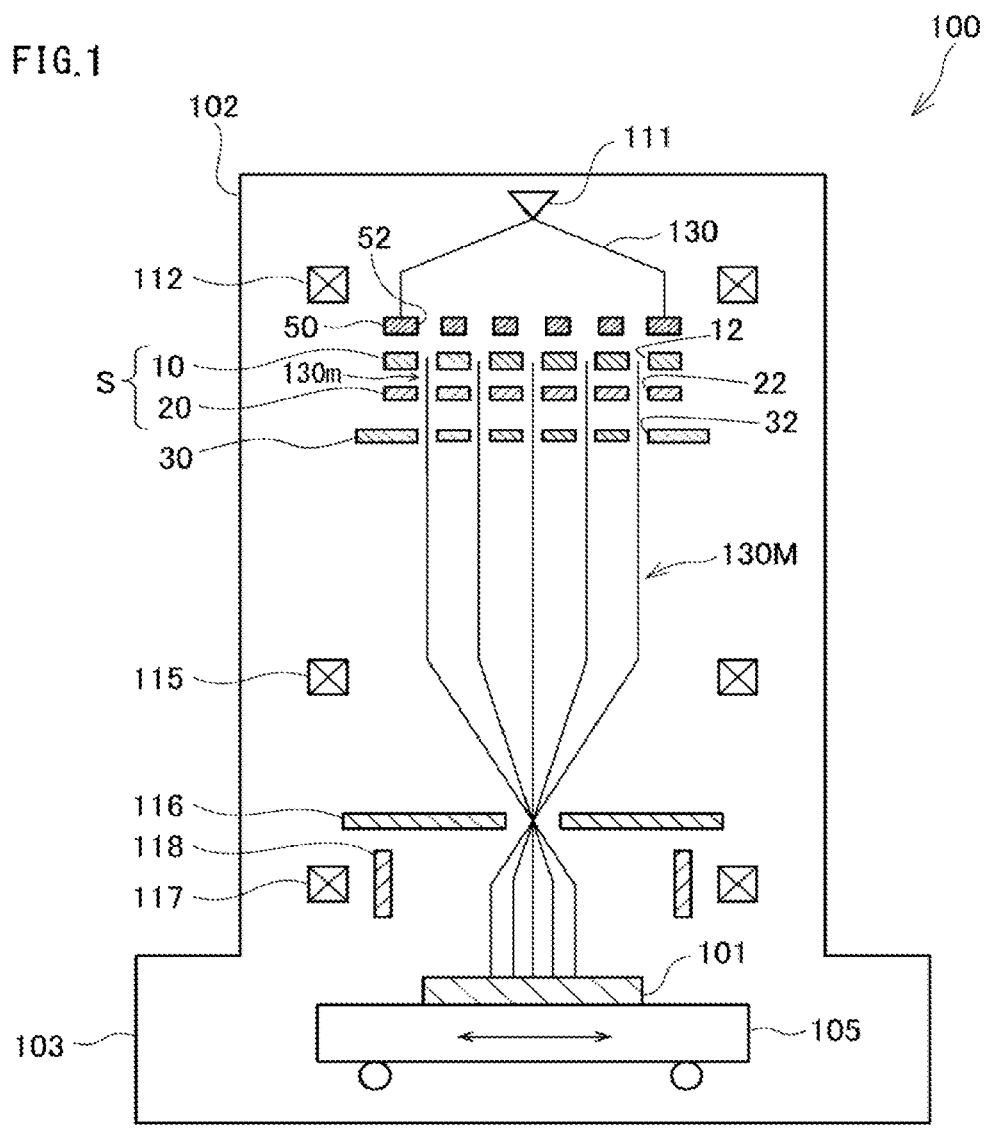
FIG. 1 is a schematic view of a writing apparatus according to an embodiment of the present invention.

FIG. 1 is a schematic structural view of a writing apparatus according to the embodiment. The writing apparatus 100 illustrated in FIG. 1 is an example of a multi charged particle beam writing apparatus. The writing apparatus 100 includes an electron lens column 102 and a writing chamber 103. An electron gun 111, an illumination lens 112, an aperture substrate set S (a set of aperture substrates), a blanking aperture array substrate 30, a reduction lens 115, a limitation aperture member 116, an objective lens 117, and a deflector 118 are arranged inside the electron lens column 102.

The aperture substrate set S includes a first shaping aperture array substrate 10 and a second shaping aperture array substrate 20. The first shaping aperture array substrate 10 blocks most of an electron beam reaching there. Therefore, heat converted from kinetic energy of the electron beam generates at an aperture surface. A pre-aperture array substrate 50 may be further disposed above the first shaping aperture array substrate 10 in order to reduce a heat load exerted on the first shaping aperture array substrate 10. The pre-aperture array substrate 50 includes openings having a size larger than openings of the first shaping aperture array substrate 10. Hereinafter, a configuration in which the pre-aperture array substrate 50 is provided will be described, but the pre-aperture array substrate 50 may not be provided.

An XY-stage 105 is arranged inside the writing chamber 103. A substrate 101 such as a mask is arranged on the XY-stage 105. The substrate 101 serves as a writing target substrate when writing is performed. The substrate 101 may be an exposure mask for use in manufacturing a semiconductor device, or a semiconductor substrate (silicon wafer) from which a semiconductor device is manufactured. The substrate 101 may be also a mask blank applied with a resist.

Figure 2A:
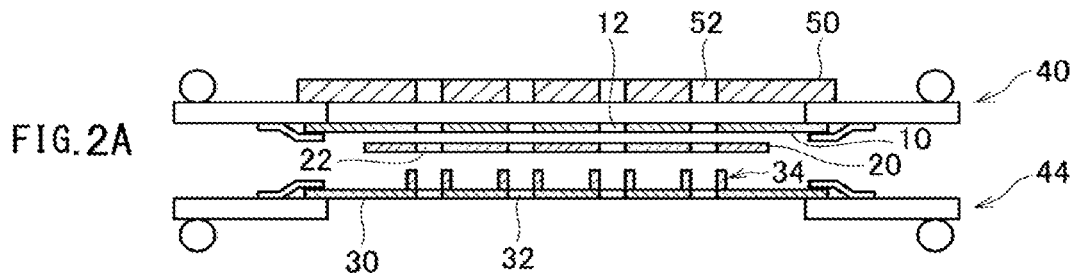
FIG. 2A is a schematic view of a set of aperture substrates.
Figure 2B:
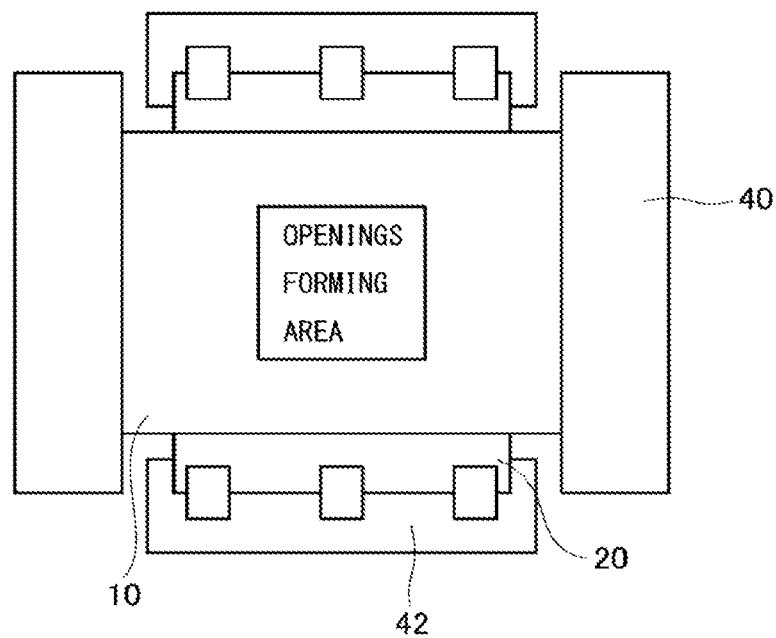
FIG. 2B is an illustration representing a mounting example of shaping aperture array substrates.

As illustrated in FIGS. 2A and 2B, the first shaping aperture array substrate 10 is mounted to a movable stage 40. The second shaping aperture array substrate 20 is mounted to a movable stage 42 and is arranged under the first shaping aperture array substrate 10. A blanking aperture array substrate 30 is mounted to a movable stage 44 and is arranged under the second shaping aperture array substrate 20. Although the movable stage is provided for each of the first shaping aperture array substrate 10, the second shaping aperture array substrate, and the blanking aperture array substrate 30, the movable stage may be provided for any two of these three aperture array substrates.

Figure 3A:
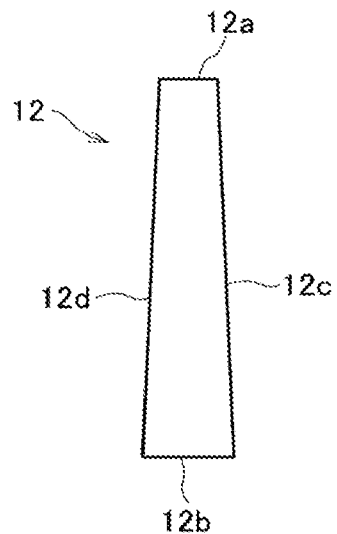
FIGS. 3A and 3B illustrate examples of an opening shape.

Openings (first openings) 12 are formed in the first shaping aperture array substrate 10. The openings 12 are arranged in a pattern having m rows in vertical direction and n columns in horizontal direction (m, n 2) at a predetermined array pitch. Each of the openings 12 has an elongated shape extending along a predetermined direction as illustrated in FIG. 3A. Each opening 12 is in the form of a rectangle having a pair of opposite sides 12a and 12b and a pair of non-parallel opposite sides 12c and 12d. A width of the opening 12 in a width direction (the left-right direction in FIG. 3A) perpendicular to a lengthwise direction varies along the lengthwise direction (the up-down direction in FIG. 3A) of the opening 12. The openings 12 may have an isosceles trapezoid shape having a pair of parallel sides (bases) 12a and 12b and a pair of non-parallel sides (legs) 12c and 12d. The opening width gradually increases from the side 12a toward the side 12b.

Figure 3B:
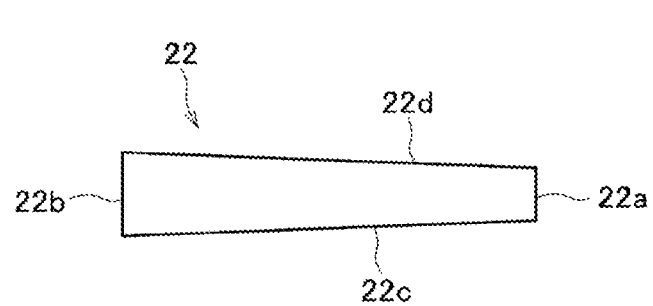

Openings (second openings) 22 are formed in the second shaping aperture array substrate 20 in alignment with positions at which the openings 12 of the first shaping aperture array substrate 10 are arranged. Each of the openings 22 has an elongate shape extending along a predetermined direction as illustrated in FIG. 3B. An extension direction (lengthwise direction) of the opening 22 is perpendicular to the extension direction of the opening 12, and the opening 22 has the same shape as that resulting from rotating the opening 12 in a horizontal plane by 90°.

In one embodiment, the opening 22 has an isosceles trapezoid shape having a pair of parallel sides (bases) 22a and 22b and a pair of non-parallel sides (legs) 22c and 22d. A width of the opening 22 in a width direction (an up-down direction in FIG. 3B) perpendicular to the extension direction varies along the extension direction of the opening 22 (the left-right direction in FIG. 3B). The width of the opening 22 gradually increases from the side 22a toward the side 22b.

Openings (fourth openings) 52 are formed in the pre-aperture array substrate 50 in alignment with the positions at which the openings 12 of the first shaping aperture array substrate 10 are arranged. Each of the openings 52 may have a rectangular or circular shape. From the viewpoint of reducing the heat load exerted on the first shaping aperture array substrate 10, each of the openings 52 is preferably as small as possible within a range larger than a maximum size of a beam shaped by the openings 12 and 22. For example, each size of the openings 52 is preferably set to be larger than the length of the sides 12a and 22a and smaller than the length of the sides 12c, 12d, 22c and 22d of the opening 12.

Figure 4:
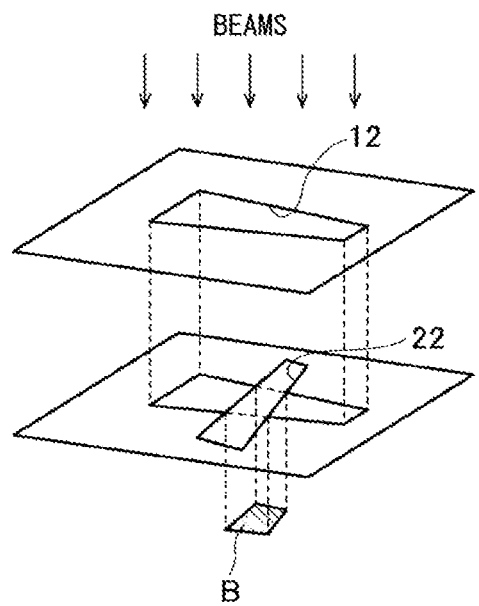
FIG. 4 illustrates an example of beam shaping.
Figure 5:
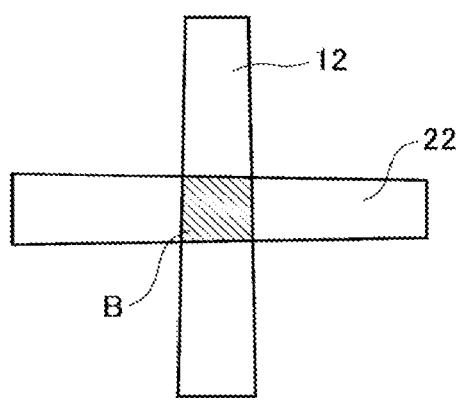
FIG. 5 illustrates an example of the beam shaping.

Beams after having passed through the openings 52 of the pre-aperture array substrate 50 illuminate the openings 12 of the first shaping aperture array substrate 10. As illustrated in FIGS. 4 and 5, the beams (first multiple beams 130m) after having passed through the openings 12 of the first shaping aperture array substrate 10 pass through the openings 22 of the second shaping aperture array substrate 20. Thus, multiple beams 130M (second multiple beams, see FIG. 1) are formed by passing a part of an electron beam 130 through the openings 12 and 22.

In the case of using the aperture array substrates 10 and 20 having the openings 12 and 22 illustrated in FIGS. 3A and 3B, a shape of each beam B of the multiple beams 130M is not a perfect rectangle but is a rectangle in which opposite sides are slightly non-parallel. However, such a shape does not degrade writing accuracy. The reason is that, because a size and shape of a pattern after development of a resist are determined depending on a dose profile subjected to actions of a blur of a beam image attributable to an optical system and a blur caused by diffusion of reaction materials in the resist, a smaller variation of the beam shape than a width of each of the blurs does not affect the size and shape of the pattern if a current amount of the beam is calibrated.

The lengthwise direction of each opening 12 is parallel. The lengthwise direction of each opening 22 is parallel. The openings 12 and the openings 22 are arranged such that their lengthwise directions are perpendicular to each other when viewed in plan. A size of each beam B of the multiple beams 130M can be adjusted by adjusting relative positions of the opening 12 and the opening 22 with the movable stages 40 and 42.

Namely, when the movable stage is moved in the lengthwise direction of the opening 12, the beam size in a direction perpendicular to the movement direction of the opening 12 is changed by a smaller value than an amount of the movement of the opening 12. Similarly, when the movable stage is moved in the lengthwise direction of the opening 22, the beam size in a direction perpendicular to the movement direction is changed by a smaller value than an amount of the movement. Accordingly, the sizes of the substantially rectangular beam B in the two directions can be independently adjusted at higher accuracy than mechanical position accuracy of the movable stages. Furthermore, influences of relative positional deviations of aperture positions caused by unintentional positional deviations of the movable stages during operation of the writing apparatus and caused by changes in temperature at the aperture and an aperture holder appear in the beam size as a smaller change than amounts of the relative positional deviations of the openings. Accordingly, high stability can be obtained in the aperture size defining the beam size.

Figure 6A:
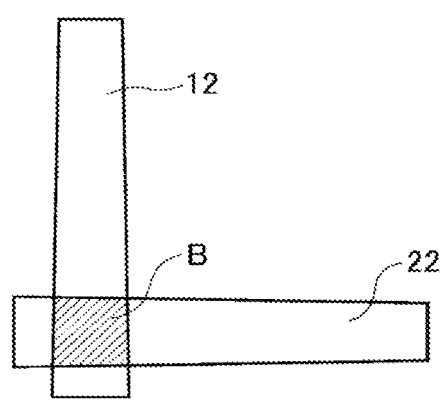
FIGS. 6A and 6B illustrate examples of the beam shaping.

As illustrated in FIG. 6A, for example, the size of each beam B can be increased by adjusting the position of the movable stage to arrange the first shaping aperture array substrate 10 and the second shaping aperture array substrate 20 such that the beam having passed through a relatively wide portion of the opening 12 passes through a relatively wide portion of the opening 22.

Figure 6B:
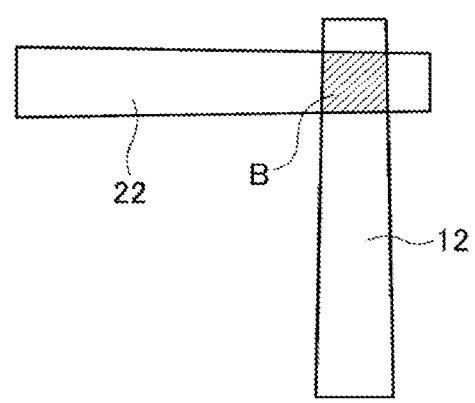

As illustrated in FIG. 6B, the size of each beam B can be reduced by adjusting the position of the movable stage to arrange the first shaping aperture array substrate 10 and the second shaping aperture array substrate 20 such that the beam having passed through a relatively narrow portion of the opening 12 passes through a relatively narrow portion of the opening 22.

In this embodiment, each beam is shaped by the paired opposite sides 12c and 12d of the opening 12 and the paired opposite sides 22c and 22d of the opening 22.

The blanking aperture array substrate 30 is disposed under the second shaping aperture array substrate 20. Openings (third openings) 32 are formed in the blanking aperture array substrate 30 in alignment with positions at which the openings 22 of the second shaping aperture array substrate 20 are arranged. A blanker 34 constituted by a pair of two electrodes (see FIG. 2A) is arranged near each of the openings 32. The two electrodes are arranged opposite to each other with the opening 32 positioned therebetween. One of the two electrodes is fixedly held at a ground potential, and the other electrode is switched between the ground potential (beam-on state) and a different potential (beam-off state).

The electron beam passing through each opening 32 is independently controlled to a beam-on state or a beam-off state for each beam depending on a voltage applied to each blanker 34. When the beam is controlled into the beam-on state, the opposite electrodes of the blanker 34 are controlled to be held at the same potential, so that the blanker 34 does not deflect the beam. When the beam is controlled into the beam-off state, the opposite electrodes of the blanker 34 are controlled to be held at different potentials, so that the blanker 34 deflects the beam. Each blanker 34 performs blanking deflection of each beam of the multiple beams 130M having passed through the openings 12 of the first shaping aperture array substrate 10 and the openings 22 of the second shaping aperture array substrate 20.

In the writing apparatus 100 in which the above-described aperture substrate set S including the first shaping aperture array substrate 10 and the second shaping aperture array substrate 20 is installed, the electron beam 130 emitted from the electron gun 111 (emission unit) illuminates the pre-aperture array substrate 50 through the illumination lens 112. The electron beam 130 passes through the openings 52 of the pre-aperture array substrate 50, the openings 12 of the first shaping aperture array substrate 10, and the openings 22 of the second shaping aperture array substrate 20, whereby the plurality of electron beams (multiple beams) 130M are formed. The multiple beams 130M pass between the electrodes of the corresponding blankers 34 and through the corresponding openings 32 of the blanking aperture array substrate 30 in one-to-one relation.

The multiple beams 130M having passed through the blanking aperture array substrate 30 are reduced by the reduction lens 115. The multiple beams 130M ideally pass through a common point in a hall of the limitation aperture member 116 in the on-state of all the beams. Paths of the beams are adjusted by an alignment coil, not illustrated, such that the above-mentioned point is positioned in the hole of the limitation aperture member 116. In the off-state of the beams, each beam is deflected by the blanker 34 on the blanking aperture array substrate 30 and travels along a path toward outside the hole of the limitation aperture member 116. Hence the beam is blocked by the limitation aperture member 116. On the other hand, in the on-state of the beams, each beam is not deflected by the blanker 34, and hence the beams pass through the hole of the limitation aperture member 116. In such a manner, on/off of the beams is switched by blanking control with the blanking aperture array substrate 30.

As described above, the limitation aperture member 116 blocks each beam of the multiple beams that have been deflected at the beam-off state of the blankers 34. Beams for one shot are formed by the beams having passed through the limitation aperture member 116 during a period from beam-on to beam-off.

The multiple beams having passed through the limitation aperture member 116 are focused by the objective lens 117 and are projected onto the substrate 101 at a desired reduction rate. The multiple beams are entirely deflected by the deflector 118 so as to travel in the same direction together and are applied to respective beam irradiation positions on the substrate 101. When the XY-stage 105 is continuously moved, the beam irradiation positions are controlled by the deflector 118 so as to follow the movement of the XY-stage 105.

As described above, the longitudinal and lateral sizes (vertical and horizontal sizes in FIG. 5) of each of the multiple beams can be independently adjusted to various values in units of a smaller value than an amount of the movement of the shaping aperture by adjusting the relative positions of the first shaping aperture array substrate 10 and the second shaping aperture array substrate 20 in this embodiment. When the writing pattern has a difference between its vertical and horizontal sizes, the beam is preferably shaped by setting a difference between the vertical and horizontal beam sizes so as to cancel the difference in the writing pattern.

Figure 7A:
FIGS. 7A to 7C illustrate examples of the opening shape.
Figure 7B:
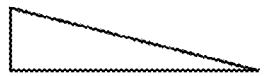
Figure 7C:

The openings 12 and 22 are each just required to have a shape having a width that varies in the widthwise direction. Thus, the opening shape is not limited to an isosceles trapezoid, and it may be an isosceles triangle such as illustrated in FIG. 7A, or a right triangle such as illustrated in FIG. 7B. Alternatively, as illustrated in FIG. 7C, the opening shape may be a rectangle having two non-parallel opposite sides.

Figure 8A:
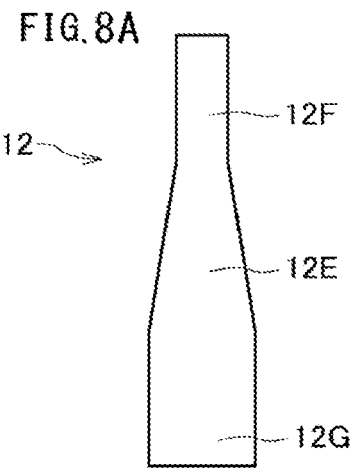
FIGS. 8A and 8B illustrate examples of the opening shape.
Figure 8B:
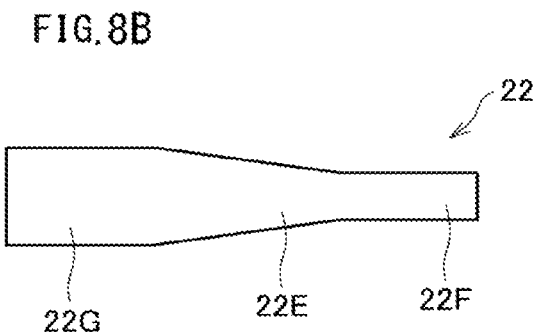

As illustrated in FIGS. 8A and 8B, the openings 12 and 22 may have shapes including width varying portions 12E and 22E, width fixed portions 12F and 22F continuously joined to one ends of the width varying portions 12E and 22E, and width fixed portions (width constant portions) 12G and 22G continuously joined to the other ends of the width varying portions 12E and 22E, respectively. The width fixed portions 12F, 22F, 12G and 22G are each a region having parallel opposite sides and a constant width in the widthwise direction. The width fixed portions 12F and 22F correspond to minimum widths of the width varying portions 12E and 22E, while the width fixed portions 12G and 22G correspond to maximum widths of the width varying portions 12E and 22E.

Figure 9A:
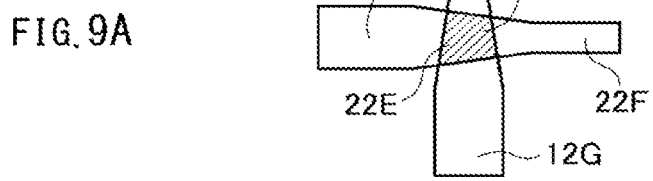
FIGS. 9A to 9C illustrate examples of the beam shaping.

As illustrated in FIG. 9A, the size of each of the multiple beams can be adjusted by adjusting the relative positions of the first shaping aperture array substrate 10 and the second shaping aperture array substrate 20 such that the beam having passed through the width varying portion 12E of the opening 12 passes through the width varying portion 22E of the opening 22. Each beam is shaped by paired opposite sides of the width varying portion 12E and paired opposite sides of the width varying portion 22E.

Figure 9B:
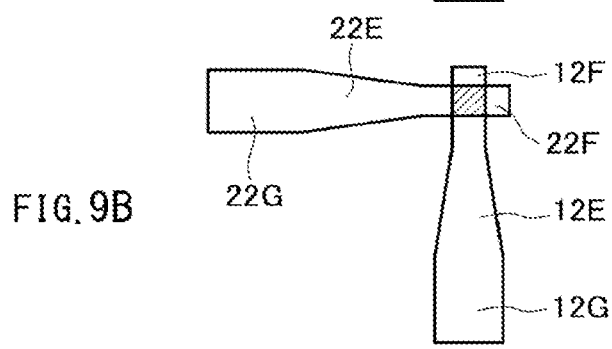

As illustrated in FIG. 9B, each of the multiple beams can be set to a predetermined small size by adjusting the relative positions of the first shaping aperture array substrate 10 and the second shaping aperture array substrate 20 such that the beam having passed through the width fixed portion 12F of the opening 12 passes through the width fixed portion 22F of the opening 22. Each beam is shaped by paired opposite sides of the width fixed portion 12F and paired opposite sides of the width fixed portion 22F.

Figure 9C:
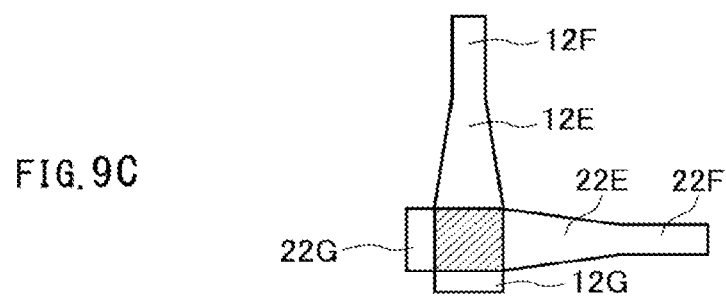

As illustrated in FIG. 9C, each of the multiple beams can be set to a predetermined large size by adjusting the relative positions of the first shaping aperture array substrate 10 and the second shaping aperture array substrate 20 such that the beam having passed through the width fixed portion 12G of the opening 12 passes through the width fixed portion 22G of the opening 22. Each beam is shaped by paired opposite sides of the width fixed portion 12G and paired opposite sides of the width fixed portion 22G.

In examples illustrated in FIGS. 9B and 9C, the beam size can be held constant even when the positions of the first shaping aperture array substrate 10 and the second shaping aperture array substrate 20 are slightly deviated. Furthermore, when a rectangular aperture is formed as one aperture, it is difficult to form an aperture opening with high accuracy at corners of the rectangular shape. In the examples illustrated in FIGS. 9B and 9C, corners of a rectangular beam can easily be shaped by using two apertures.

Figure 10A:
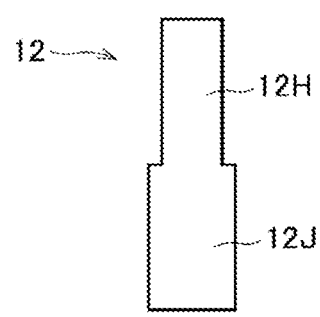
FIGS. 10A and 10B illustrate examples of the opening shape.
Figure 10B:
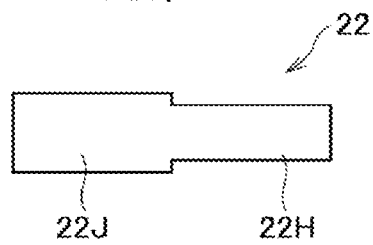

As illustrated in FIGS. 10A and 10B, the openings 12 and 22 may have eight-cornered shapes defined by rectangular width fixed portions 12H and 22H having relatively narrow widths, and by rectangular width fixed portions 12J and 22J having relatively wide widths and continuously joined to the width fixed portions 12H and 22H, respectively.

Figure 11A:
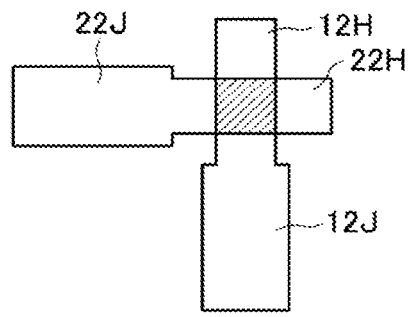
FIGS. 11A to 11C illustrate examples of the beam shaping.

As illustrated in FIG. 11A, each of the multiple beams can be set to a predetermined small size by adjusting the relative positions of the first shaping aperture array substrate 10 and the second shaping aperture array substrate 20 such that the beam having passed through the width fixed portion 12H of the opening 12 passes through the width fixed portion 22H of the opening 22. Each beam is shaped by paired opposite sides of the width fixed portion 12H and paired opposite sides of the width fixed portion 22H.

Figure 11B:
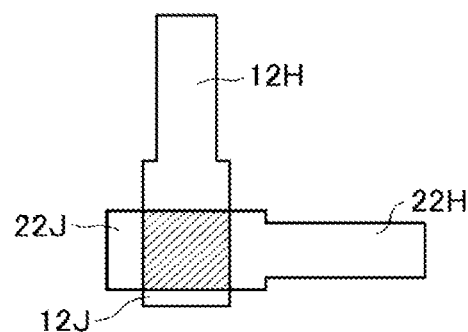

As illustrated in FIG. 11B, each of the multiple beams can be set to a predetermined size by adjusting the relative positions of the first shaping aperture array substrate 10 and the second shaping aperture array substrate 20 such that the beam having passed through the width fixed portion 123 of the opening 12 passes through the width fixed portion 22J of the opening 22. Each beam is shaped by paired opposite sides of the width fixed portion 123 and paired opposite sides of the width fixed portion 223.

Also in examples illustrated in FIGS. 11A and 11B, the beam size can be held constant even when the positions of the first shaping aperture array substrate 10 and the second shaping aperture array substrate 20 are slightly deviated.

Figure 11C:
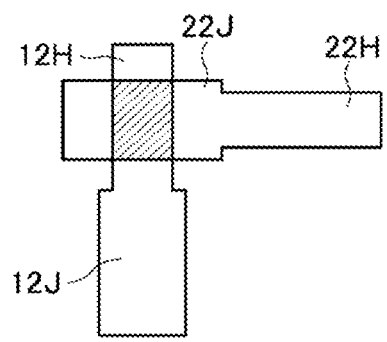

Each of the multiple beams is not always required to be set to provide similar shapes, and the shape of each beam may be changed. For example, the beam shape may be changed from a square to a rectangle. As illustrated in FIG. 11C, the size of each of the multiple beams may be set to a predetermined medium size in the rectangular shape, instead of the square shape illustrated in FIGS. 11A and 11B, by adjusting the relative positions of the first shaping aperture array substrate 10 and the second shaping aperture array substrate 20 such that the beam having passed through the width fixed portion 12H of the opening 12 passes through the width fixed portion 223 of the opening 22.

Figure 12A:
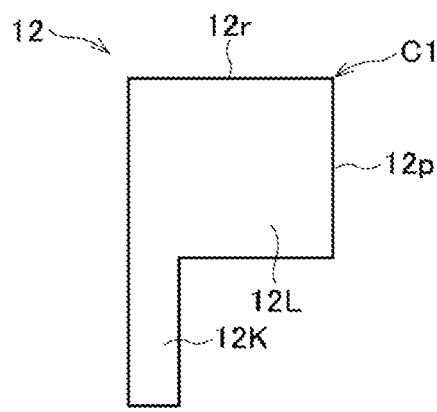
FIGS. 12A and 12B illustrate examples of the opening shape.
Figure 12B:
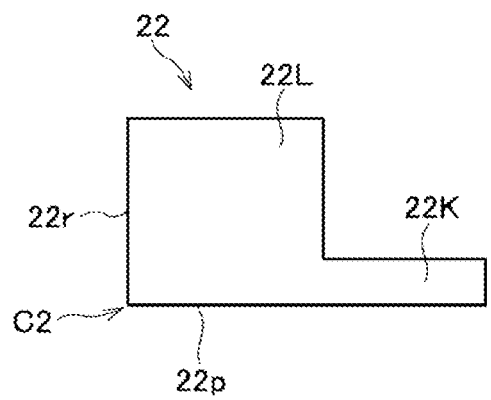

As illustrated in FIGS. 12A and 12B, the openings 12 and 22 may have hexagonal shapes defined by rectangular width fixed portions 12K and 22K having relatively narrow widths, and by rectangular width fixed portions 12L and 22L having relatively wide widths and continuously joined to the width fixed portions 12K and 22K, respectively.

Figure 13A:
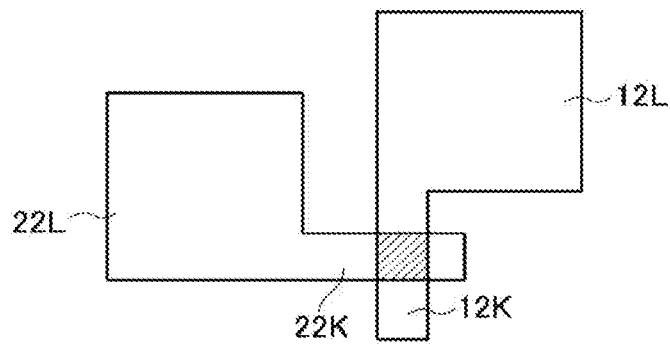
FIGS. 13A and 13B illustrate examples of the beam shaping.

As illustrated in FIG. 13A, each of the multiple beams can be set to a predetermined small size by adjusting the relative positions of the first shaping aperture array substrate 10 and the second shaping aperture array substrate 20 such that the beam having passed through the width fixed portion 12K of the opening 12 passes through the width fixed portion 22K of the opening 22. Each beam is shaped by paired opposite sides of the width fixed portion 12K and paired opposite sides of the width fixed portion 22K. At this time, even if the relative position between the first shaping aperture array substrate 10 and the second shaping aperture array substrate 20 slightly shifts, the size of the shaped beam does not change.

Figure 13B:
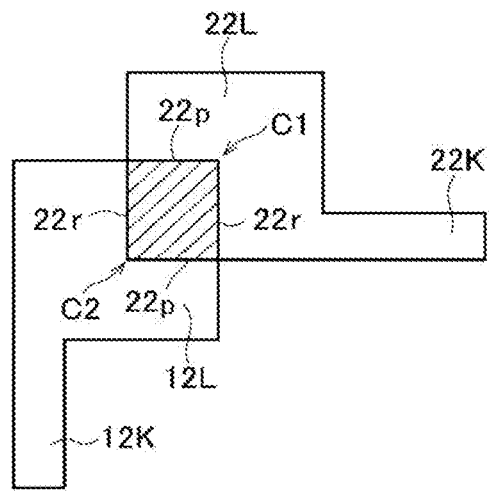

As illustrated in FIG. 13B, each of the multiple beams can be adjusted to various sizes by adjusting the relative positions of the first shaping aperture array substrate 10 and the second shaping aperture array substrate 20 such that the beam having passed through a corner region C1 of the width fixed portion 12L of the opening 12 passes through a corner region C2 of the width fixed portion 22L of the opening 22.

The corner region C1 corresponds to a region in which one ends of adjacent sides 12p and 12r of the opening 12 are joined to each other. The corner region C2 corresponds to a region in which one ends of adjacent sides 22p and 22r of the opening 22 are joined to each other. Thus, in an example illustrated in FIG. 13B, each beam of the multiple beams is shaped by the adjacent sides 12p and 12r and the adjacent sides 22p and 22r of the opening 22.

In an example illustrated in FIG. 13A, the beam size can be held constant even when the positions of the first shaping aperture array substrate 10 and the second shaping aperture array substrate 20 are slightly deviated. In the example illustrated in FIG. 13B, a variable range of the beam size can be widened.

Although the beam size is adjusted by using the movable stages in this embodiment, the beam size may be adjusted by beam deflection without using the movable stage. In other words, a shaping deflector may be disposed above the second shaping aperture array substrate 20, and the size of the beam projected onto the substrate 101 after passing through the second shaping aperture array substrate 20 may be adjusted by controlling, with beam deflection, a position of a beam image after passing through the first shaping aperture array substrate 10 on the second shaping aperture array substrate 20. The shaping deflector may be two-stage deflection to compensate for beam trajectory deflection for shaping. The second shaping deflector is provided below the first shaping deflector, and above or below the second shaping aperture array substrate 20.

At this time, the shaping deflector deflects the entire multiple beams collectively, and can adjust the size of each beam of the multiple beams collectively. Also, the multiple beams can be divided into a plurality of areas, deflected for each area, and the beam size can be adjusted for each area. In addition, each beam of the multiple beams can be individually deflected, and the beam size can be adjusted for each beam.

In the above embodiment, the electron beam writing apparatus has been described as an example, but the embodiment can also be applied to other charged particle beam apparatus such as a charged particle beam inspection apparatus.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A set of aperture substrates for multiple beams, the set of aperture substrates comprising:
   a first shaping aperture array substrate including a plurality of first openings, the first shaping aperture array substrate being irradiated with a charged particle beam in a region in which the first openings are formed whereby first multiple beams are formed with a part of the charged particle beams having passed respectively through the first openings; and
   a second shaping aperture array substrate including a plurality of second openings through which corresponding first multiple beam passes respectively whereby second multiple beams are formed with a part of the first multiple beams having passed through the plurality of second openings,
   wherein each of the second multiple beams is shaped by a pair of opposite sides of the first opening and a pair of opposite sides of the second opening.

2. The set of aperture substrates according to claim 1, wherein the first openings and the second openings include a width varying portion having non-parallel opposite sides.

3. The set of aperture substrates according to claim 2, wherein a lengthwise direction of the first openings and a lengthwise direction of the second openings are perpendicular to each other, and
   a width of each first opening and each second opening in a widthwise direction varies along the lengthwise direction of each opening.

4. The set of aperture substrates according to claim 3, wherein the first opening or the second opening has an isosceles trapezoidal shape.

5. The set of aperture substrates according to claim 2, wherein the first openings and the second openings include a width fixed portion joined continuously to the width varying portion.

6. The set of aperture substrates according to claim 1, wherein the first openings or the second openings have an isosceles triangular shape or a right triangular shape.

7. The set of aperture substrates according to claim 1, wherein the first openings and the second openings include a width fixed portion having parallel opposite sides.

8. The set of aperture substrates according to claim 7, wherein each of the first openings and the second openings includes a first width fixed portion and a second width fixed portion having a larger width than the first width fixed portion.

9. A multi charged particle beam apparatus comprising:
   an emitter emitting a charged particle beam;
   the set of aperture substrates for multiple beams according to claim 1;
   a blanking aperture array substrate blanking each beam of the second multiple beams individually,
   a deflector deflecting the multiple beams such that at least part of the second multiple beams is irradiated to a predetermined position on an irradiation target substrate;
   a plurality of movable stages adjusting positions of at least two of the first shaping aperture array substrate, the second shaping aperture array substrate, and the blanking aperture array substrate independently.

10. The apparatus according to claim 9, further comprising a pre-aperture array substrate disposed between the emitter and the first shaping aperture array substrate and having openings formed in alignment with positions at which the plurality of first openings are arranged.

11. The apparatus according to claim 10, wherein each opening formed in the pre-aperture array substrate has a size larger than a length of a side of the first opening in a widthwise direction and smaller than a length of a side of the first opening in a lengthwise direction.

* * * * *